United States Patent [19]
Meikle et al.

[11] Patent Number: 5,231,306
[45] Date of Patent: Jul. 27, 1993

[54] TITANIUM/ALUMINUM/NITROGEN MATERIAL FOR SEMICONDUCTOR DEVICES

[75] Inventors: Scott G. Meikle; Sung C. Kim; Donald L. Westmoreland, all of Boise, Id.

[73] Assignee: Micron Technology, Inc., Boise, Id.

[21] Appl. No.: 828,721

[22] Filed: Jan. 31, 1992

[51] Int. Cl.$^5$ ............................................. H01L 23/48
[52] U.S. Cl. .................................. 257/751; 257/750; 257/763; 257/765; 257/771
[58] Field of Search ...................... 357/68, 67, 71, 65; 257/751, 750, 763, 765, 771

[56] References Cited

U.S. PATENT DOCUMENTS

| | | | |
|---|---|---|---|
| 4,823,182 | 4/1989 | Okumura | 357/71 |
| 4,926,237 | 5/1990 | Sun et al. | 357/67 |
| 4,976,839 | 12/1990 | Inoue | 357/71 |
| 4,977,440 | 12/1990 | Stevens | 357/68 |
| 4,980,239 | 12/1990 | Harada et al. | 428/552 |
| 4,990,997 | 2/1991 | Nishida | 357/68 |
| 5,093,710 | 3/1992 | Higuchi | 357/67 |

OTHER PUBLICATIONS

The effects of chlorine content on the properties of titanium carbonitride thin film deposited by plasma assisted chemical vapor deposition By Si Bum Kim, Si Kyung Choi, and Soung Soon Chun, Jul./Aug. 1991.

*Primary Examiner*—Eugene R. LaRoche
*Assistant Examiner*—Viet Q. Nguyen
*Attorney, Agent, or Firm*—Dorr, Carson, Sloan & Peterson

[57] ABSTRACT

A barrier material for use in preventing interdiffusion of silicon and aluminum at silicon/aluminum interfaces comprises a layer of titanium, aluminum, and nitrogen between about 100Å and 1000Å thick. The barrier material comprises between 1% and 20% aluminum, between 30% and 60% titanium, and between 30% and 60% nitrogen. The TiAlN material is more resistant to diffusion than TiN and can be etched and sputtered like TiN. It has better thermal budget than TiN and better stability on silicon, and thus can replace TiN in many of its uses in semiconductor devices.

10 Claims, 7 Drawing Sheets

TITANIUM/ALUMINUM/NITROGEN MATERIAL FOR SEMICONDUCTOR DEVICES

BACKGROUND OF THE INVENTION

1. Field of the Invention

The invention in general relates to semiconductor device fabrication, and more particularly to a new material useful in semiconductor devices for many purposes, such as to prevent interdiffusion at silicon/metal interfaces.

2. Statement of the Problem

As is well-known, integrated circuits, often called semiconductor devices, are generally mass produced by fabricating hundreds of identical circuit patterns on a single semiconducting wafer, which wafer is subsequently sawed into hundreds of identical dies or chips. While integrated circuits are commonly referred to as "semiconductor devices" they are in fact fabricated from various materials which are either electrical conductors, such as aluminum or tungsten, electrical nonconductors, such as silicon dioxide, or electrical semiconductors, such as silicon. Silicon, the most commonly used semiconductor material, can be used in either the single crystal or polycrystalline form. In the integrated circuit fabrication art, polycrystalline silicon is usually called "polysilicon" or simply "poly". The electrical conductivity of both forms of silicon may adjusted over a wide range of conductivities by adding impurities to it, which is commonly referred to as "doping".

In the state-of-the-art semiconductor devices, it is common for the design to require interfaces of silicon and a metal such as aluminum or tungsten. For example, aluminum and tungsten are commonly used as the material of choice for electrical contacts, which contacts interface with electrically active areas made of doped silicon. It is also common in the fabrication of semiconductor devices to anneal the devices at elevated temperatures, such as 500° C. At these temperatures the metal and silicon will rapidly interdiffuse into each other at the interface. Even at room temperature, the metal and silicon will interdiffuse over time. Such interdiffusion changes the semiconductive properties of the silicon and causes defective devices. Thus it is common practice to provide a diffusion barrier at silicon/metal interfaces in semiconductor devices. A thin film of titanium nitride (TiN) or titanium tungsten (TiW) are conventionally used as diffusion barriers. Such diffusion barrier films are typically of the order of 200Å–1000Å thick.

Conventional diffusion barriers, while generally effective at room temperature, tend to fail at more elevated temperatures. Many preferred semiconductor fabrication processes, such as deposition, reflow, and annealing, require elevated temperatures. Thus conventional diffusion barriers can create limits on the processes that can be used to fabricate a semiconductor device. There is a need for a diffusion barrier that is more effective than conventional barriers, especially at elevated temperatures.

The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. As the density of circuitry increases, the contacts used in the devices develop high aspect ratios; that is, they become deeper and narrower. Conventional deposition techniques, e.g. sputtering, have difficulty coating such deep, narrow recesses, because the atoms tend to contact one of the walls before reaching the bottom of the recess. Thus, with respect to diffusion barriers, the use of conventional production techniques, such as sputtering, leads to a decrease in the thickness of the diffusion barrier at the base of a contact as the aspect ratio increases. As the thickness of the diffusion barrier decreases, the ability of the diffusion barrier to withstand thermal energy introduced in subsequent processing decreases, and the reliability of the device degrades. Thus there has been an impetus in the industry toward new barrier technology that will deposit an adequate barrier in high aspect ratio contacts, which impetus has tended toward the development of equipment and materials not presently used in semiconductor device fabrication. Generally, a change in one phase of the fabrication process usually impacts other phases. Since semiconductor device fabrication processes are highly complex and require sophisticated equipment, developments or entirely new o processes and materials can be quite costly. Thus a diffusion barrier that is more effective and yet can be incorporated into current fabrication technology would be highly desirable because expensive modification of equipment and processes can be avoided.

3. Solution to the problem

The present invention provides a semiconductor device material comprising titanium/aluminum/ nitrogen (TiAlN) alloy. The TiAlN alloy of the invention is more effective as a diffusion barrier than the conventional TiN diffusion barriers.

The TiAlN etches readily in $NH_4OH/H_2O_2$ similar to TiN and can be fabricated using standard sputtering equipment, therefore it can be easily incorporated into existing fabrication technologies.

The invention also provides a material that has a greater thermal budget than prior art diffusion barrier materials, thus it is more compatible with high temperature process, such as high temperature sputtering, aluminum melting/reflow using lasers or some other heating procedure, and annealing.

The TiAlN semiconductor device material according to the invention is thermally stable i.e. resistant to diffusion at high temperatures, thus preventing resistance changes, formation of undesirable precipitates which may make etching difficult, and facilitating a larger process window. Furthermore, because TiAlN is more effective as a barrier than prior art materials and has a higher thermal budget, a thinner diffusion barrier can be used. Thus the invention allows the use of conventional techniques to deposit the barrier films in high aspect ratio contacts.

SUMMARY OF THE INVENTION

The invention provides a diffusion barrier for preventing interdiffusion of silicon and a metal at a silicon/metal interface, the diffusion barrier comprising an alloy of titanium, nitrogen, and aluminum.

In another aspect, the invention provides a semiconductor device comprising: a layer of silicon; and a layer of alloy comprising titanium, aluminum, and nitrogen on the layer of silicon. Preferably, the semiconductor device further comprises a layer of metal on the layer of alloy. Preferably, the metal is aluminum. Preferably, the alloy comprises between 1% and 20% aluminum, between 30% and 50% titanium, and between 30% and 60% nitrogen. Preferably, the layer of alloy is generally between 100Å and 1000Å thick, and nominally varies in thickness between about 200Å and about 800Å. In an alternative embodiment, the layer of silicon comprises silicon dioxide.

The invention also provides a method of fabricating a semiconductor device comprising the steps of: providing a silicon surface; and creating a layer of material comprising titanium, aluminum and nitrogen on the silicon surface. Preferably, the method further comprises the step of creating a layer of metal on the layer of material. Preferably, the step of creating a layer of metal comprises creating a layer of aluminum. Preferably, the step of providing a silicon surface comprises proving a semiconductor wafer having a layer of silicon at least partially covering its surface, and preferably the layer of silicon is doped. Or, alternatively, the step of providing a silicon surface comprises providing a semiconductor wafer having a layer of silicon dioxide at least partially covering its surface. Preferably, the step of creating comprises depositing the layer of material, preferably by sputtering. Preferably, the step of sputtering comprises sputtering from a Ti/Al alloy target. Alternatively, the step of sputtering comprises cosputtering titanium and aluminum in an atmosphere of nitrogen. Preferably, the sputtering deposition power for the aluminum is from 1/10 to ½ the sputtering deposition power for the titanium, and the sputtering deposition power for the titanium is between 2 kilowatts and 4 kilowatts. Preferably, the step of creating comprises creating a layer of between 100Å and 1000Å thick.

The invention provides a material that not only provides better resistance to diffusion than prior art diffusion barriers, but is also easier to incorporate into many of the existing semiconductor fabrication processes, and thus can replace TiN in its many applications in semiconductor devices. Numerous other features, objects and advantages of the invention will become apparent from the following description when read in conjunction with the accompanying drawings.

DESCRIPTION OF THE PREFERRED EMBODIMENT

1. Overview

Figure 1:
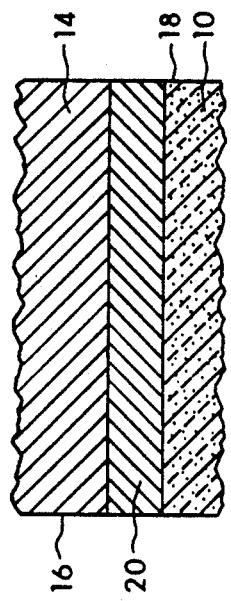
FIG. 1 depicts cross-section of a silicon/aluminum interface with a diffusion barrier according to the invention between them.

Turning now to FIG. 1 a cross-section of an interface of silicon 10 and aluminum 14 having a diffusion barrier 20 between the silicon 10 and aluminum 14 is shown. The diffusion barrier 20 is generally much thinner than the silicon 10 and aluminum 14, and thus the entire thickness of silicon 10 and aluminum 14 is not shown. In FIG. 2B a graph of atomic fraction as measured by Rutherford backscattering analysis for a material according to the invention deposited on a silicon dioxide layer on a silicon substrate is shown. The figure shows that the material of the invention comprises an alloy of titanium, aluminum, and nitrogen, which we shall refer to herein as TiAlN. In this specification the term alloy means a solid mixture. The mixture in not necessarily homogenous on a microscopic scale, and in fact, as shown in FIG. 2B, in the preferred embodiment the relative concentration of each component varies to some degree throughout the diffusion barrier. However, as also shown in this figure, there is admixture of all three elements entirely through the material. Then, comparing FIG. 4A to FIG. 4B, it is evident that when a diffusion barrier of TiAlN is used between the silicon and aluminum at a silicon/aluminum interface there is much less pitting of the silicon surface than when a diffusion barrier of TiN is used. In fact, the silicon surface when the barrier was TiAlN (FIG. 4A) shows no pitting at all, while the silicon surface when the barrier was TiN (FIG. 4B) shows extensive pitting.

2. Detailed Description of the Fabrication

Turning now to a more detailed description of the invention, interfaces between aluminum and silicon occur often in the design of integrated circuits, for example DRAMs. The structure of the actual interface will often be more complex than shown in FIG. 1, which depicts a microscopic section of an interface according to the invention. In the preferred embodiment semiconductor 10 is lightly P-doped single crystal silicon of about 10 ohm-cm bulk resistivity, although the invention also applies to any other form of silicon or doping of silicon that may be used in semiconductors. The term "silicon" is also intended to include silicon compounds, such as silicon dioxide. The thickness of the diffusion barrier 20 is preferably about 500Å to 1000Å, although the invention contemplates any thickness of such material that may be used in semiconductors. Elements other than silicon and aluminum may be adjacent the interface, such as along the boundaries 16 and 18. In any actual diffusion barrier 20, the thickness will also likely vary at different places along the horizontal in FIG. 1, since the processes of depositing the diffusion barrier, such as sputtering, will not be perfectly uniform due to non-uniform topography.

Figure 2A:
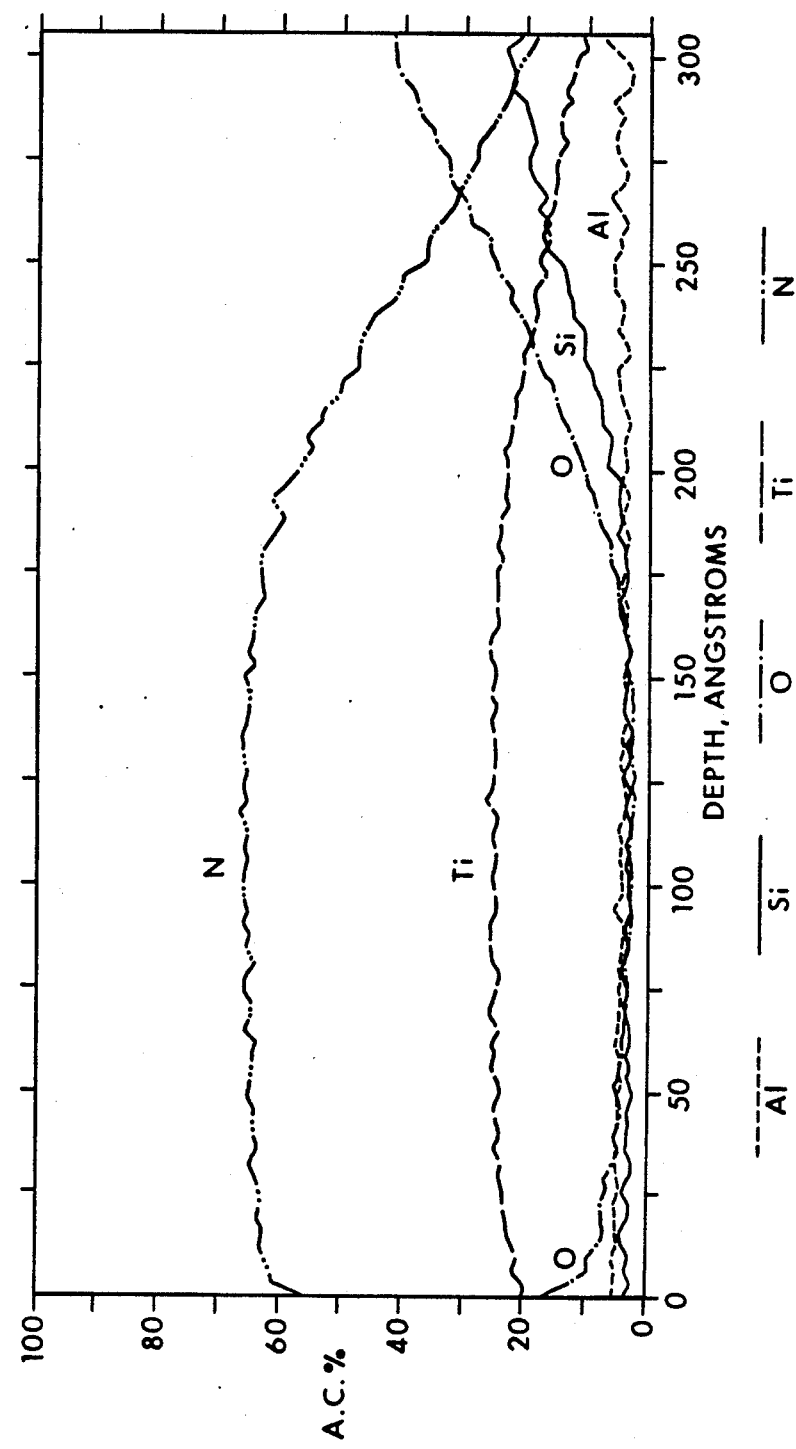
FIG. 2A is a graph of atomic concentration as a percent versus depth for a material according to the invention as measured by Auger electron spectroscopy.
Figure 2B:
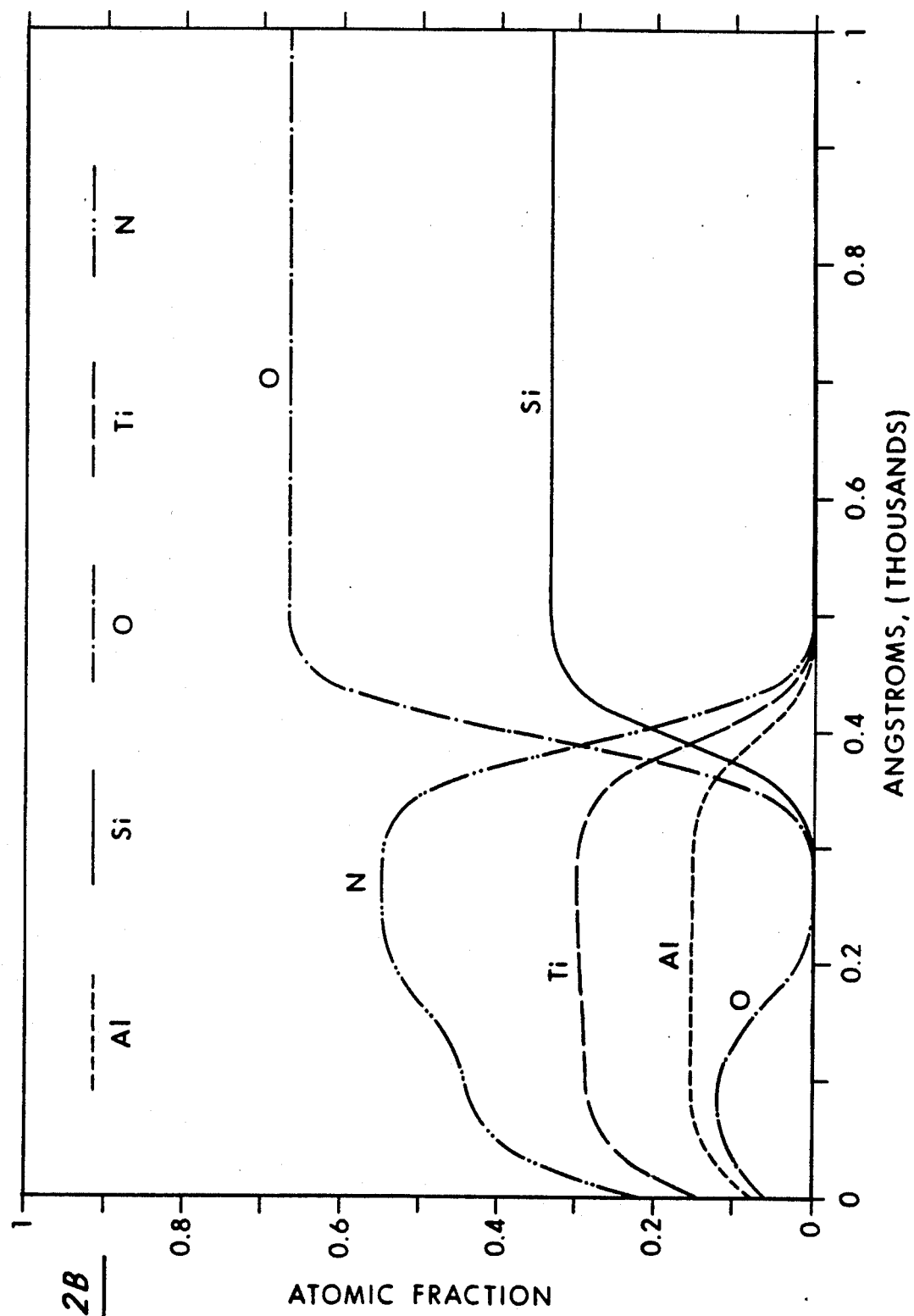
FIG. 2B is a graph of atomic fraction versus depth for a material according to the invention as measured by Rutherford backscattering analysis.

The atomic concentration as a percent of the titanium, aluminum, and nitrogen as measured by Auger electron spectroscopy (AES) in a diffusion barrier having relative concentrations of titanium, aluminum, and nitrogen according to the preferred embodiment of the invention deposited on a silicon dioxide layer over a silicon substrate is shown in FIG. 2A. The concentration is given as a function of depth into a layer of the material cosputtered onto the silicon dioxide layer. The profile shows that there are significant concentrations of aluminum, titanium, and nitrogen throughout the film. The aluminum content of the film is estimated as approximately 3% in this spectrum (but see below). Titanium and nitrogen content cannot be determined using AES as the Auger signals overlap in the spectrum.

FIG. 2B shows the results of a Rutherford backscattering analysis (RBS) showing the atomic fraction for a different sample. The sample of FIG. 2B is not the preferred embodiment, however, the graph is useful to assist in determining the correct approximate concentrations in the preferred embodiment of the material on of FIG. 2A. That is, the AES of FIG. 2A, although able to determine accurately relative atomic concentrations, is typically less accurate than RBS in defining absolute concentrations. Thus, RBS data, like that of FIG. 2B, can be used to calibrate Auger data. The aluminum content from the RBS data is 14% while the AES (not shown) for the same sample gives a value of 6.5%. Thus, by comparison, it can be estimated that the aluminum content of the sample of FIG. 2A is actually approximately 6.5%. This indirect analysis is necessary because RBS data is not presently available for the sample of FIG. 2A.

The RBS spectrum shows the atomic fraction of the titanium, aluminum, and nitrogen rising as one goes into the material, as is to be expected. The aluminum levels off at about 14%, the titanium levels off at about 30%, and the nitrogen levels off at about 55% after an initial artifact due to the replacement of the nitrogen by oxygen. Just as there was for the sample in FIG. 2A, there are significant concentrations of aluminum, titanium, and nitrogen completely through the sample of FIG. 2B. RBS measurements of a TiN sample (not shown) prepared under similar conditions show the concentration to be nitrogen 55% and titanium 44%. Thus it can be extrapolated that the nitrogen content of the sample of FIG. 2A is also approximately 55%, giving, for the sample of the preferred embodiment in FIG. 2A, approximate overall atomic concentrations of nitrogen 55%, titanium 37%, and aluminum 6.5%. It should also be noted that some small amount of impurities, such as carbon, may have been present in some samples fabricated. The impurities were less than 2% and are not shown in the graphs. Finally, it is noted that there is some oxygen near the surface of the barrier in both spectrums, with perhaps a bit more in the RBS spectrum than in the AES spectrum. This is believed to be due to the samples being exposed to air during handling, and the surfaces partially oxidized.

Figure 3:
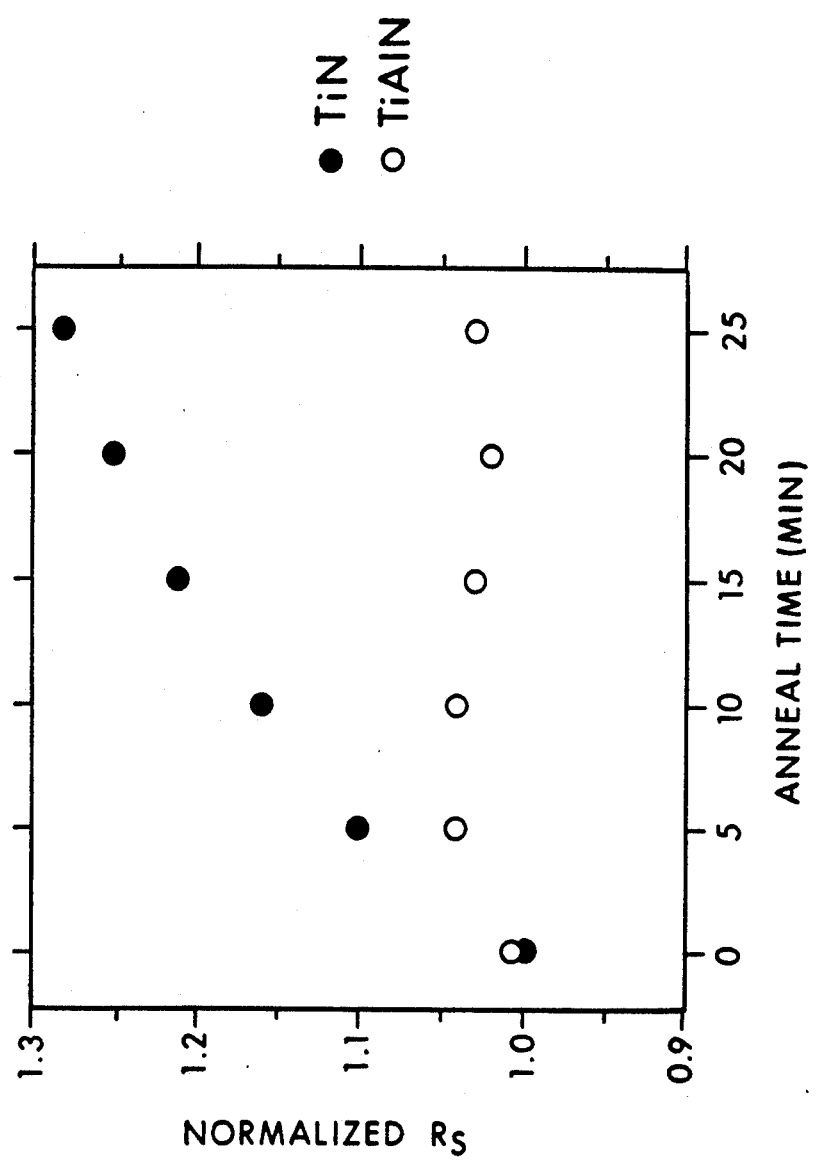
FIG. 3 is a graph of the normalized sheet resistance versus anneal time for diffusion barriers of TiN and TiAlN.

FIG. 3 shows a graph of normalized sheet resistivity, $R_s$, versus anneal time in minutes for a diffusion barrier of TiN and a diffusion barrier of TiAlN. The TiAlN film was prepared in the same was as the sample of FIG. 2A above. The TiN film was cosputtered at conditions giving approximately 55% nitrogen and 45% titanium. The anneals were performed at 500° C. in argon ambient. The film thickness in each case is approximately 175Å, and the substrate in each case is lightly P-doped silicon. As can be seen from the graph, the sheet resistance for the TiN increases with increasing anneal time at a substantially greater rate than that for TiAlN, which shows that the TiAlN is more stable on silicon than TiN.

It is known that for TiN a nitrogen-rich film (e.g. N-55%, Ti-45%) provides a better diffusion barrier. We have used N-rich TiN in our comparison studies, described below, in order to compare the new material, TiAlN, to the "best" TiN.

Figure 4A:
FIG. 4A is a photomicrograph showing the surface of a silicon wafer after a sandwich structure of silicon/TiN/aluminum was annealed for 5 minutes at 500° C.
Figure 4B:
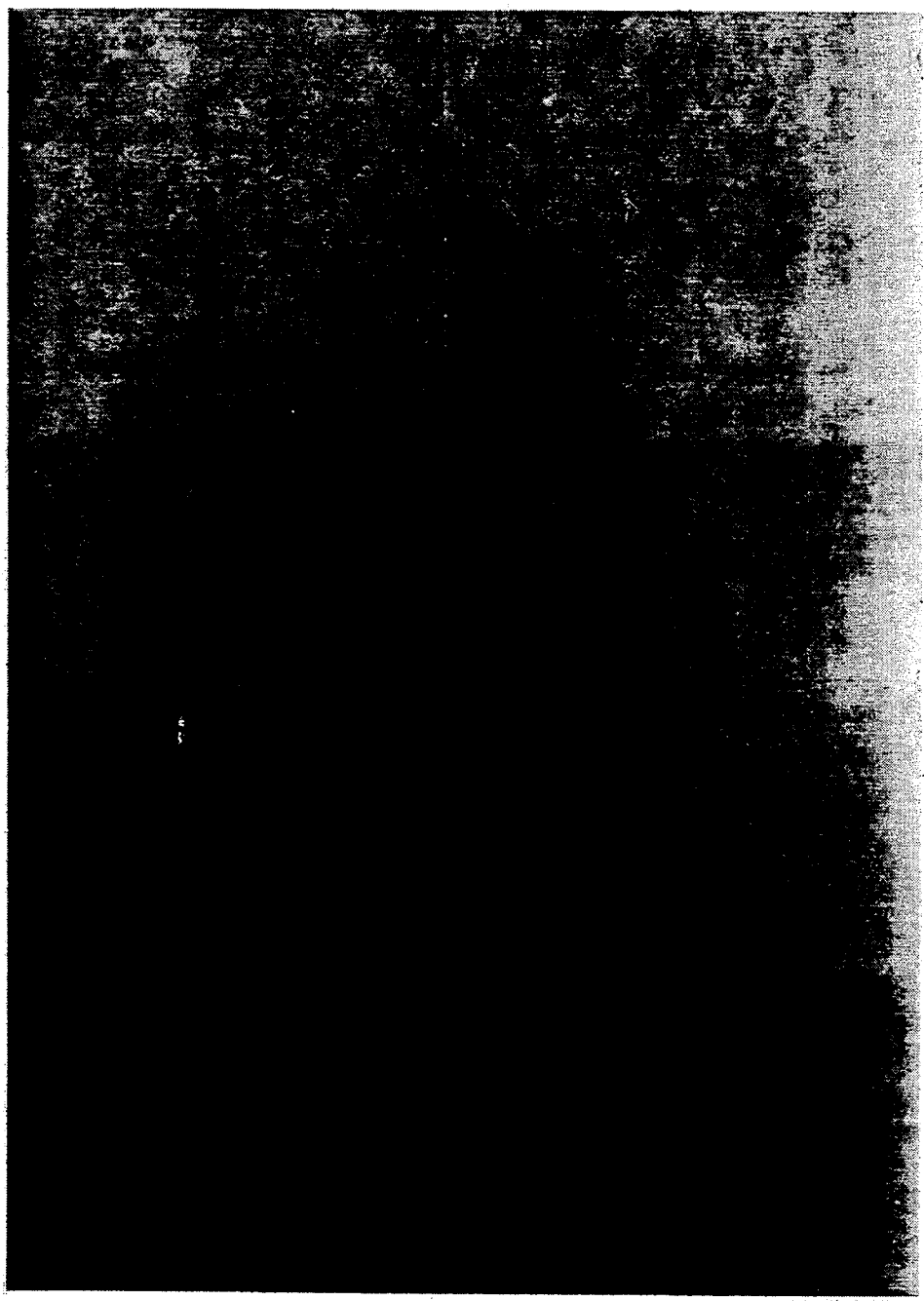
FIG. 4B is a photomicrograph showing the surface of a silicon wafer after a sandwich structure of silicon/TiAlN/aluminum was annealed for 5 minutes at 500° C.
Figure 4C:
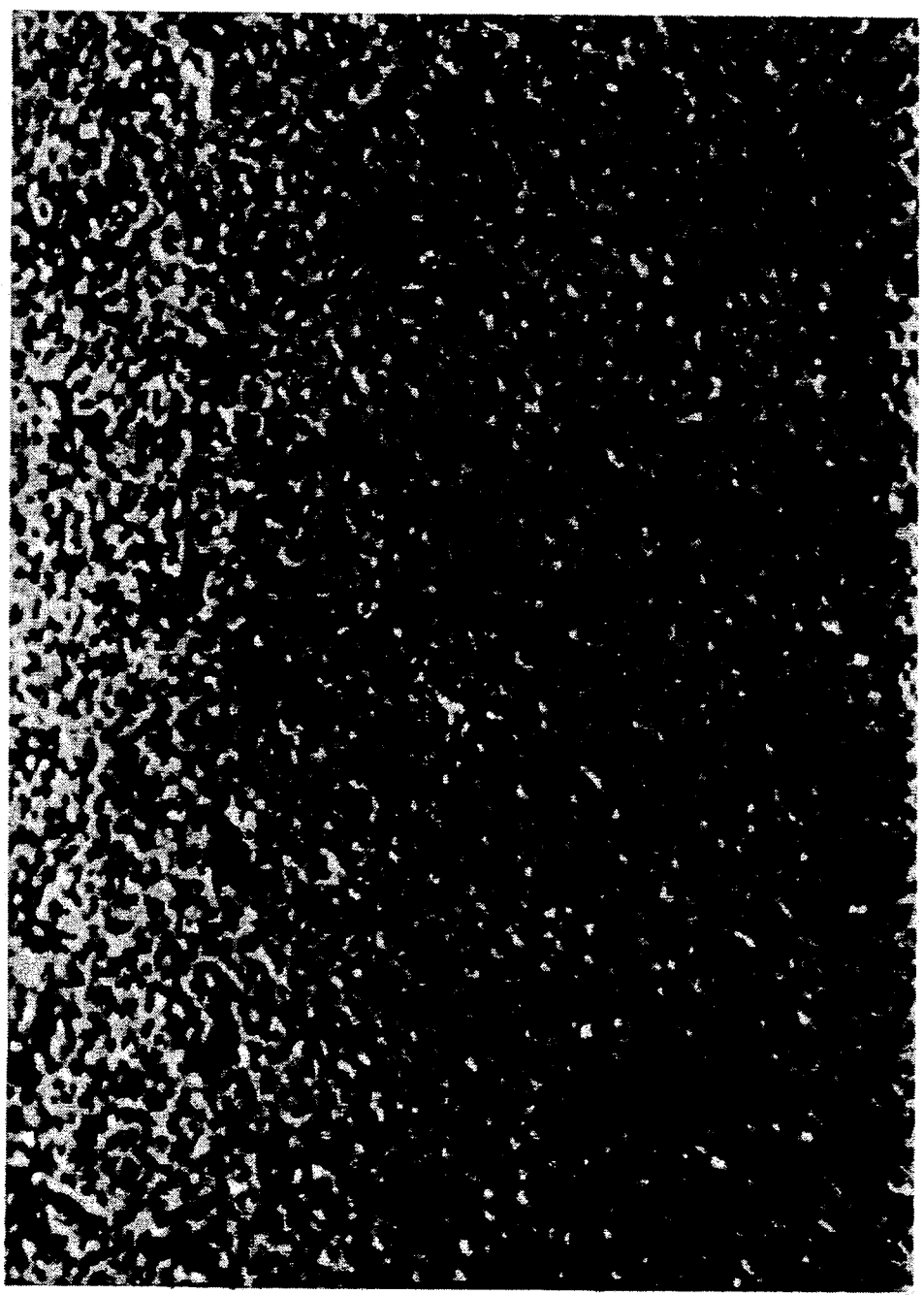
FIG. 4C is a photomicrograph showing the surface of a silicon wafer after a sandwich structure of silicon/TiAN/aluminum was annealed for 5 minutes at 550° C.
Figure 4D:
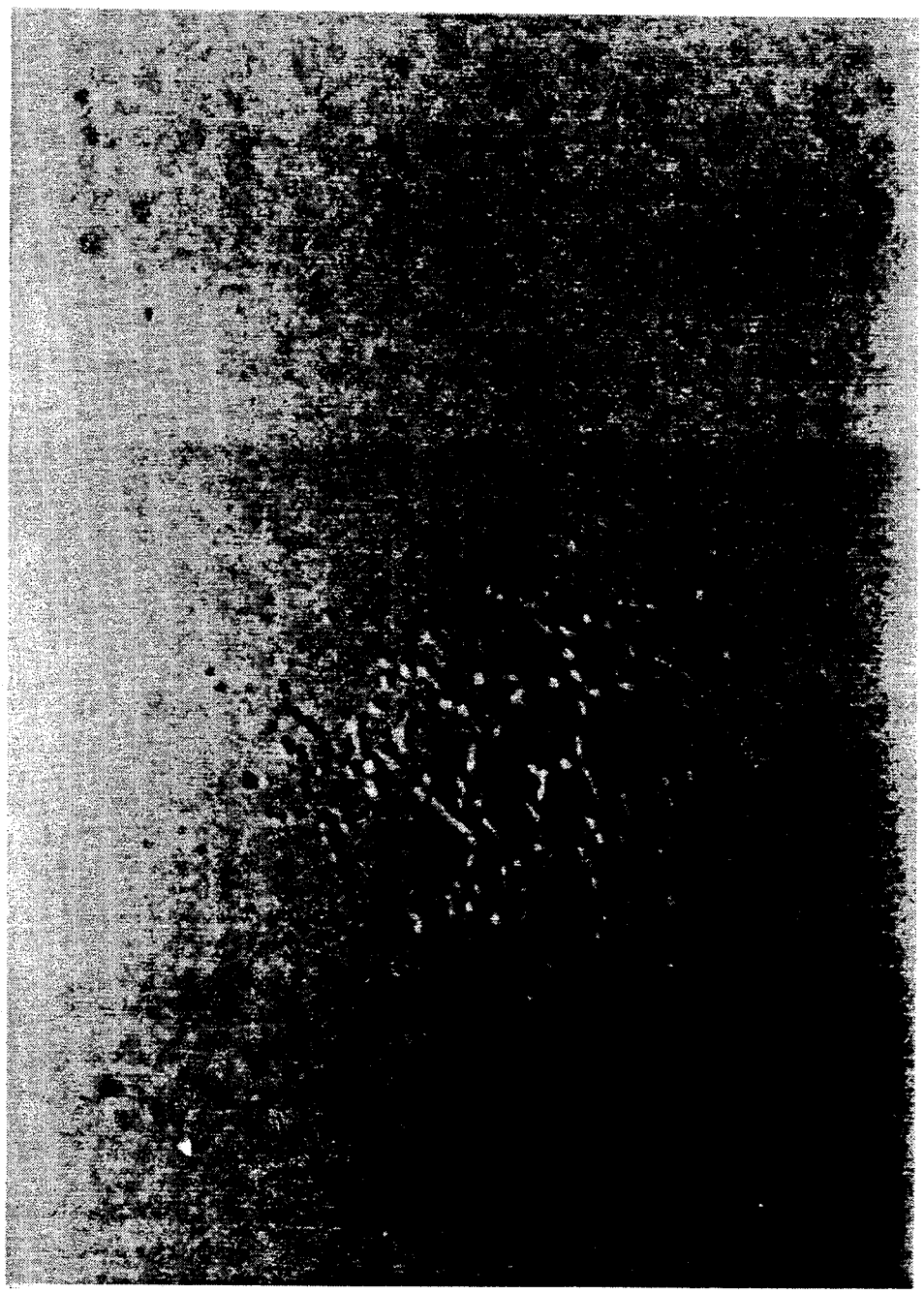
FIG. 4D is a photomicrograph showing the surface of a silicon wafer after a sandwich structure of silicon/TiAlN/aluminum was annealed for 5 minutes at 550° C.

FIGS. 4A and 4C are photographs of the surface of silicon wafers after sandwich structures of silicon/TiN-/aluminum were annealed at 500° C. (FIG. 4A) and 550° C. (FIG. 4C) for five minutes. In each instance the thickness of the TiN was approximately 175Å to 200Å, the thickness of the aluminum was approximately 5000Å, and a section of the silicon was selected that showed the worst case of pitting. FIGS. 4B and 4D are photographs of the surface of silicon wafers after sandwich structures of silicon/TiAlN/aluminum were annealed at 500° C. (FIG. 4B) and 550° C. (FIG. 4D) for five minutes. In each instance the thickness of the TiAlN was approximately 175Å to 200Å, the thickness of the aluminum was approximately 5000Å, and a section of the silicon was selected that showed the worst case of pitting. Comparing FIGS. 4A and 4B, at 500° C., the sample using the TiN barrier shows considerable pitting by aluminum atoms, while with the barrier 20 according to the invention, there is no pitting. Comparing FIGS. 4C and 4D, The silicon surface is completely covered with pits in the case where the TiN diffusion barrier was used, but is only partially pitted in the sample which used the diffusion barrier 20 according to the invention. Both results indicate that the TiAlN diffusion barrier of the invention is a better diffusion barrier than the prior art diffusion barrier.

Table I shows the measured sheet resistivity for four samples of TiAlN diffusion barriers according to the invention which differed in the aluminum deposition power applied in the cosputtering process. All depositions were made by sputtering in a 100% nitrogen ambient, which yielded an approximately 55% composition of nitrogen in the film. All depositions were at room temperature, except the last, which was at 300° C. The results show that the sheet resistivity decreases with the aluminum deposition power. It is desirable to have low sheet resistivities in the usual applications of such diffusion barriers Generally, bulk resistivities of 300-500 ohm-cm or less are adequate for microelectronics applications. Thus only the lowest of the sheet resistivities shown, which is equivalent to 455 microhm-cm in bulk resistivity, is suitable for current semiconductor device applications. The sheet resistivity of a similar thickness of sputtered TiN is approximately 100 ohm/sq. Thus, the results obtained to date show an adequate sheet resistivity for semiconductor applications. Further the results show that controlling the stoichiometry controls the sheet resistivity. Thus it is to be expected that lower sheet resistivities will be obtained as experience with the new diffusion barrier grows.

TABLE I

| Titanium Dep. Power | Aluminum Dep. Power | Sheet Resistance | Thickness |
|---|---|---|---|
| 3 KW | 1.5 KW | 6900 ohm/sq | ~175-200Å |
| 3 KW | 0.54 KW | 1500 ohm/sq | ~175-200Å |
| 3 KW | 0.38 KW | 712 ohm/sq | ~175-200Å |
| 3 KW | 0.38 KW | 260 ohm/sq | ~175-200Å |

Further experiments have been performed on the deposition process in which the nitrogen concentration has been varied, by adding argon gas, while holding the Ti/Al sputtering deposition power ratio constant. Taking the nitrogen concentration down to 25% from 100% changes the sheet resistance from 455 to 670 microhm-cm. While this change is not in the direction desired, it does present further evidence that the sheet resistance can be altered by stoichiometry changes, and thus suggests that further stoichiometry experimentation may lead to a much improved barrier material.

While the samples discussed above were prepared by cosputtering titanium and aluminum, which is generally more convenient in the experimental lab, since the relative proportions of the materials are easier to modify, in the preferred embodiment of the process according to the invention, a single target of titanium/aluminum alloy is used. Preferably the single target comprises 95% titanium and 5% aluminum Preferably the sputtering is in a nitrogen atmosphere.

A feature of the invention is that the TiAlN diffusion barrier of the invention is more effective than the conventional diffusion barriers. It is also thermally stable, thus preventing resistance changes, formation of undesirable precipitates which may make etching difficult, and facilitating a larger process window, that is, permitting wider ranges of process parameters, such as temperatures, anneal times, etch times, etc.

Another feature of the invention is that the TiAlN diffusion barrier etches readily in $NH_4OH/H_2O_2$ similar to TiN and can be fabricated using standard sputtering equipment, therefore it can be easily incorporated into existing fabrication technologies.

A further feature is that the TiAlN diffusion barrier material that has a greater thermal budget than prior art diffusion barrier materials, thus it is more compatible with high temperature process, such as high temperature sputtering, aluminum melting/reflow using lasers or some other heating procedure, and annealing. Since TiAlN is both more effective as a barrier than prior art materials and has a higher thermal budget, a thinner diffusion barrier can be used. Such thinner diffusion barriers also result in smaller resistances, which means that even if the sheet resistance is not brought down as low or lower than that of TiN, for example, the net resistance may still be as low, since thinner films may be used.

A related feature of the invention is that the TiAlN material can replace TiN in its many applications in semiconductor devices. Since TiAlN can be incorporated into existing fabrication processes currently used for TiN, and since TiAlN has a greater thermal budget than TiN and is more thermally stable on silicon, as well as having other advantages over TiN, it can provide a larger process window in many applications. For example, it may be used as an antireflective coating on single crystal silicon, polysilicon, and silicon dioxide surfaces in semiconductor devices.

There has been described a novel semiconductor device material with improved resistance to diffusion, and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to sputter diffusion barriers of TiAlN, and that the properties of the barrier can be modified by adjusting stoichiometry, other sputtering parameters may be used. Or other fabrication processes altogether may be employed. Or the various parts described may be made with a wide variety of dimensions and materials. Additional materials may be added to the alloy. Consequently, the invention is to be construed as embracing each and every novel feature and novel combination of features present in and/or possessed by the semiconductor material and applications described.

What is claimed is:

1. A semiconductor device comprising:
   a layer having silicon; and
   a separate diffusion barrier layer of alloy comprising titanium, aluminum, and nitrogen deposited on said silicon layer.

2. A semiconductor device as in claim 1 and further comprising a layer of metal on said layer of alloy.

3. A semiconductor as in claim 2 wherein said metal is aluminum.

4. A semiconductor device as in claim 1 wherein said alloy comprises between 1% and 20% aluminum.

5. A semiconductor device as in claim 1 wherein said alloy comprises between 30% and 50% titanium.

6. A semiconductor device as in claim 1 wherein said alloy comprises between 30% and 60% nitrogen.

7. A semiconductor device as in claim 1 wherein said layer of alloy is between 100Å and 1000Å thick.

8. A semiconductor device as in claim 7 wherein said layer of alloy varies in thickness between about 175Å and about 200Å.

9. A semiconductor device as in claim 2, wherein said silicon substrate comprises silicon dioxide.

10. A diffusion barrier located between a silicon substrate and a metal film in a semiconductor device, said diffusion barrier comprising:
    a metal nitride film formed on said silicon substrate, said metal nitride film containing aluminum with an atomic concentration between 1% and 20%, containing titanium with an atomic concentration between 30% and 50%, and nitrogen with an atomic concentration between 30% and 60%, said metal film formed on said metal nitride film.

* * * * *